(12) United States Patent
Odaira

(10) Patent No.: US 11,128,274 B2
(45) Date of Patent: Sep. 21, 2021

(54) DIFFERENTIAL AMPLIFIER

(71) Applicant: Winbond Electronics Corp., Taichung (TW)

(72) Inventor: Nobuhiro Odaira, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/831,765

(22) Filed: Mar. 26, 2020

(65) Prior Publication Data

US 2020/0358411 A1 Nov. 12, 2020

(30) Foreign Application Priority Data

May 8, 2019 (JP) .............................. JP2019-088104

(51) Int. Cl.
*H03F 3/45* (2006.01)

(52) U.S. Cl.
CPC ..... *H03F 3/45273* (2013.01); *H03F 3/45475* (2013.01); *H03F 2203/45026* (2013.01); *H03F 2203/45054* (2013.01); *H03F 2203/45576* (2013.01); *H03F 2203/45622* (2013.01)

(58) Field of Classification Search
CPC ................................................... H03F 3/4527
See application file for complete search history.

(56) References Cited

U.S. PATENT DOCUMENTS

| | | | |
|---|---|---|---|
| 4,464,631 A | 8/1984 | Prentice | |
| 4,959,622 A * | 9/1990 | Kearney | H03F 3/45094 330/257 |
| 5,285,168 A * | 2/1994 | Tomatsu | H03F 3/3001 330/253 |
| 5,497,123 A | 3/1996 | Main et al. | |
| 5,729,177 A * | 3/1998 | Goutti | H03F 3/3066 330/257 |
| 6,265,941 B1 | 7/2001 | Lopata | |
| 2005/0231284 A1* | 10/2005 | Adachi | H03F 3/45192 330/255 |
| 2009/0189694 A1 | 7/2009 | Davierwalla et al. | |

(Continued)

FOREIGN PATENT DOCUMENTS

| | | |
|---|---|---|
| CN | 106533375 | 3/2017 |
| JP | H07162240 | 6/1995 |

(Continued)

OTHER PUBLICATIONS

"Office Action of Korea Counterpart Application" with English translation thereof, dated Nov. 24, 2020, p. 1-p. 12.

*Primary Examiner* — Patricia T Nguyen
(74) *Attorney, Agent, or Firm* — JCIPRNET

(57) ABSTRACT

A differential amplifier is provided. The differential amplifier includes: a differential input circuit, adjusting a second current and a third current flowing into the differential input circuit according to a first input voltage, a second input voltage, and a first current; a first current source circuit, generating the first current according to a first reference voltage; a current-mirror circuit, generating a fifth current according to a fourth current; a second current source circuit, generating a sixth current and a seventh current according to a second reference voltage; and an impedance circuit, coupled to the current-mirror circuit and a ground terminal, the differential amplifier having a low output voltage error.

9 Claims, 5 Drawing Sheets

(56) References Cited

U.S. PATENT DOCUMENTS

| | | | | |
|---|---|---|---|---|
| 2010/0289580 A1* | 11/2010 | Standley | ............. | H03F 3/45192 |
| | | | | 330/253 |
| 2011/0291760 A1* | 12/2011 | Maruyama | .......... | H03F 3/45192 |
| | | | | 330/257 |
| 2013/0257637 A1* | 10/2013 | Gotoh | .................... | H03M 1/66 |
| | | | | 341/155 |
| 2020/0204125 A1* | 6/2020 | Singh | .................... | H03F 1/0211 |
| 2020/0228066 A1* | 7/2020 | Shankar | ................ | H03F 3/4508 |

FOREIGN PATENT DOCUMENTS

| | | |
|---|---|---|
| JP | H07193441 | 7/1995 |
| JP | H1117459 | 1/1999 |
| JP | 2012238929 | 12/2012 |
| JP | 2015192447 | 11/2015 |
| KR | 20050020295 | 3/2005 |
| TW | 201633702 | 9/2016 |
| WO | 2017192700 | 11/2017 |

\* cited by examiner

DIFFERENTIAL AMPLIFIER

CROSS-REFERENCE TO RELATED APPLICATION

This application claims the priority benefit of Japan application serial no. 2019-088104, filed on May 8, 2019. The entirety of the above-mentioned patent application is hereby incorporated by reference herein and made a part of this specification.

BACKGROUND OF THE INVENTION

1. Field of the Invention

The invention relates to a differential amplifier, and more particularly, to a cascode differential amplifier.

2. Description of Related Art

The cascode differential amplifier is widely applied in unit-gain buffers due to the advantages of wider input and output ranges, and is configured to realize circuits including impedance converters, voltage regulators or comparators. FIG. 4A shows a circuit diagram of a cascode differential amplifier 400 in prior art, in which Vin1, Vin2, Vout and VDD represent a first input voltage, a second input voltage, an output voltage and a power voltage respectively. FIG. 4B shows a voltage conversion curve of a difference between the first and second input voltages and the output voltage of the cascode differential amplifier 400. The voltage conversion curve shows a shifting due to non-ideal characteristics (semiconductor process variations, etc) of elements including the transistors and resistors in the cascode differential amplifier 400. The shifting of the voltage conversion curve will cause an output voltage error +Verr1 and an output voltage error −Verr1.

SUMMARY OF THE INVENTION

The invention provides a differential amplifier that can reduce a shifting of the conversion curve of the input/out voltages, so as to reduce an output voltage error.

An embodiment of the invention proposes a differential amplifier, which includes: a differential input circuit, adjusting a second current and a third current flowing into the differential input circuit according to a first input voltage, a second input voltage, and a first current; a first current source circuit, coupled between the differential input circuit and a ground terminal, and generating the first current according to a first reference voltage; a current-mirror circuit, coupled between an output terminal and the ground terminal, and generating a fifth current according to a fourth current; a second current source circuit, coupled between a power terminal and the output terminal, and generating a sixth current and a seventh current according to a second reference voltage, a first part of the sixth current flowing into the differential input circuit and forming the second current, a second part of the sixth current flowing into the output terminal, a first part of the seventh current flowing into the differential input circuit and forming the third current, a second part of the seventh current flowing into the current-mirror circuit and forming the fourth current; and an impedance circuit, coupled between the current-mirror circuit and the ground terminal.

Based on the above, with the capability of reducing the shifting of the conversion curve of the input/output voltages to reduce the output voltage errors, the differential amplifier according to the invention is applicable to circuits that require high accuracy, such as the voltage detectors or voltage comparators.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
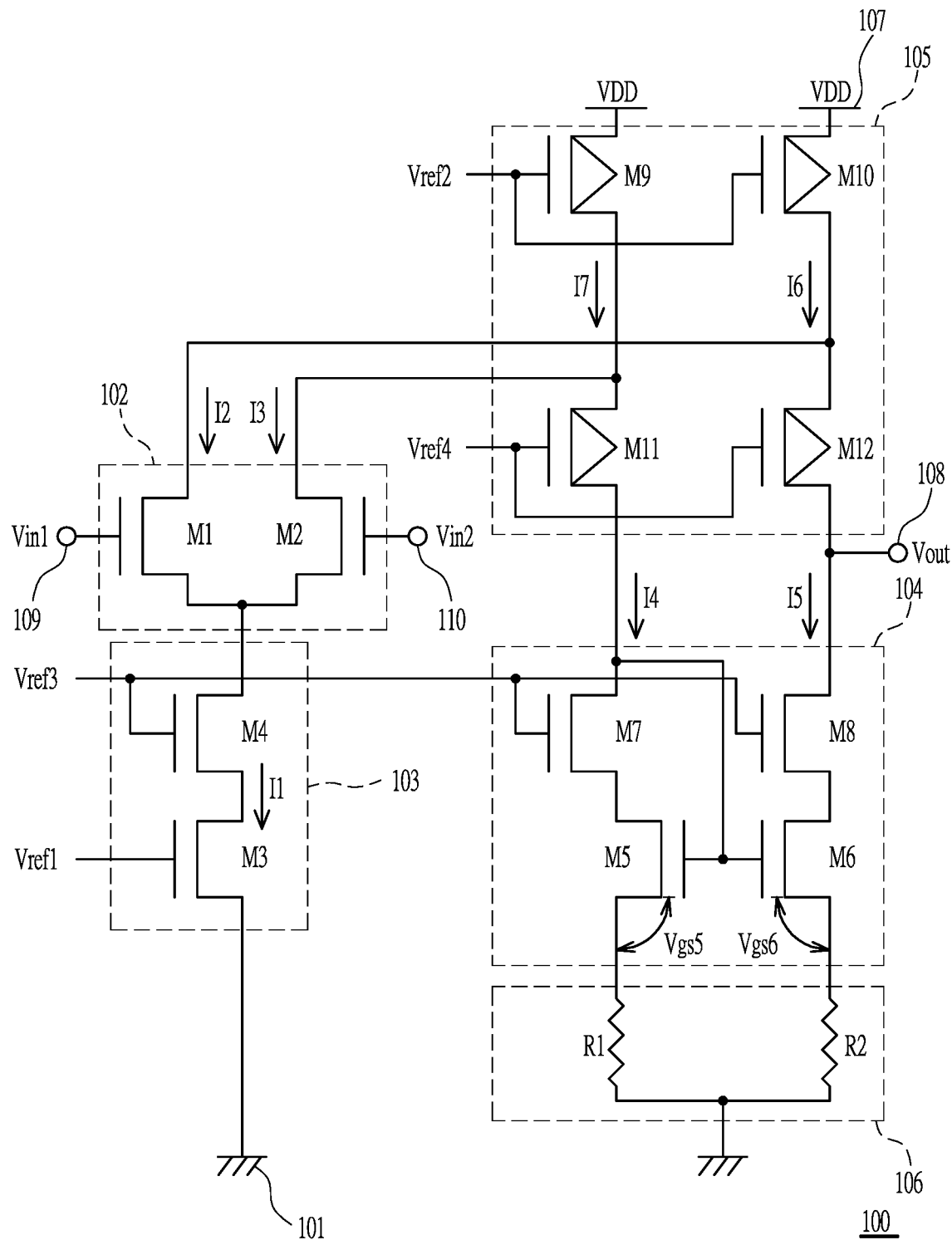
FIG. 1 is a circuit diagram showing a differential amplifier in an embodiment of the invention.

Reference will now be made in detail to the present preferred embodiments of the disclosure, examples of which are illustrated in the accompanying drawings. Wherever possible, the same reference numbers are used in the drawings and the description to refer to the same or like parts.

The embodiments of the invention will be described below with reference to accompanied drawings.

FIG. 1 is a circuit diagram showing a differential amplifier 100 in an embodiment of the invention.

The differential amplifier 100 of the present embodiment includes a ground terminal 101, a differential input circuit 102 having a first input terminal 109 and a second input terminal 110, a first current source circuit 103, a current-mirror circuit 104, a second current source circuit 105, an impedance circuit 106, a power terminal 107 and an output terminal 108.

As shown by FIG. 1, coupling relations of the above elements are as follows. The first input terminal 109 of the differential input circuit 102 is input by a first input voltage Vin1. The second input terminal 110 of the differential input circuit 102 is input by a second input voltage Vin2. A first terminal of the first current source circuit 103 is connected to a common source terminal of the differential input circuit 102. A second terminal of the first current source circuit 103 is connected to the ground terminal 101. A first control terminal of the first current source circuit 103 is input by a first reference voltage Vref1. A second control terminal of the first current source circuit 103 is input by a third reference voltage Vref3. A first output terminal of the differential input circuit 102 and a second output terminal of the differential input circuit 102 are coupled to the second current source circuit 105. A first control terminal of the second current source circuit 105 is input by a second reference voltage Vref2. A second control terminal of the second current source circuit 105 is input by a fourth reference voltage Vref4. The current-mirror circuit 104 is coupled to the second current source circuit 105 and the impedance circuit 106. A control terminal of the current-mirror circuit 104 is input by the third reference voltage. The impedance circuit 106 is coupled to the ground terminal 101. An output terminal Vout is coupled between the second current source circuit 105 and the current-mirror circuit 104. The ground terminal is input by a ground voltage. The power terminal 107 is input by a power voltage VDD.

In addition, a dimension of each element in the differential amplifier 100 is designed in a bilaterally symmetrical manner. That is, in such design, a dimension of a transistor M1 is equal to a dimension of a transistor M2; a dimension of a transistor M9 is equal to a dimension of a transistor M10; a dimension of a transistor M11 is equal to a dimension of a transistor M12; a dimension of a transistor M7 is equal to a dimension of a transistor M8; a dimension of a transistor M5 is equal to a dimension of a transistor M6; and a dimension of a resistor R1 is equal to a dimension of a resistor R2.

Operations of the differential amplifier 100 configured as above are described as follows.

With reference to FIG. 1, it is assumed herein that the differential amplifier 100 has no non-ideal effects such as process variation and so on. The P-type transistors M9 and the P-type transistor M10 of the second current source circuit 105 generate a sixth current I6 and a seventh current I7 according to the second reference voltage Vref2. A first part of the sixth current I6 flows into the differential input circuit 102 and forms a second current I2. A first part of the seventh current I7 flows into the differential input circuit 102 and forms a third current I3. The second current I2 and the third current I3 flow into the first current source circuit 103. A first current I1 is formed by a sum of second current I2 and the third current I3. Due to the characteristics of the differential input circuit 102, when the first input voltage Vin1 is equal to the second input voltage Vin2, the second current I2 is equal to the third current I3; when the first input voltage Vin1 is greater than the second input voltage Vin2, the second current I2 is increased and the third current I3 is reduced; and when the first input voltage Vin1 is less than the second input voltage Vin2, the second current I2 is reduced and the third current I3 is increased. A second part of the seventh current I7 flows into the current-mirror circuit 104 and forms a fourth current I4. After flowing into the N-type transistor M5, the fourth current I4 forms a voltage difference Vgs5 between a gate and a source of N-type transistor M5. Because the voltage difference Vgs5 is equal to a voltage difference Vgs6 between a gate and a source of the N-type transistor M6, a fifth current I5 is equal to the fourth current I4.

Figure 2:
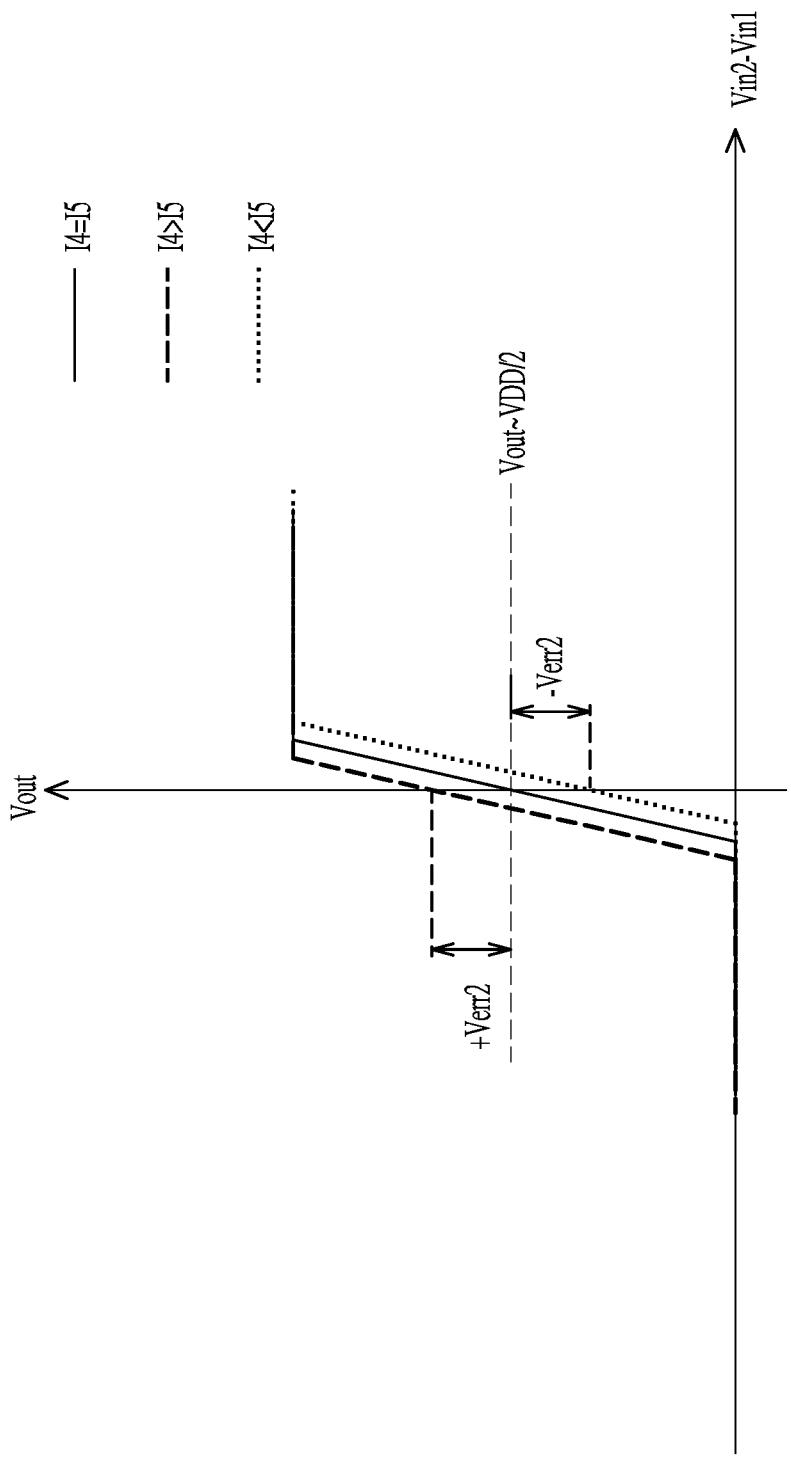
FIG. 2 is diagram showing a conversion curve of input/output voltages of the differential amplifier shown in FIG. 1.

With reference to FIG. 1 and FIG. 2, when the first input voltage Vin1 is equal to the second input voltage Vin2 in the case where the differential amplifier 100 has no non-ideal effects, the second current I2 is equal to the third current I3; the seventh current I7 is equal to the sixth current I6; and the fourth current I4 is equal to the fifth current I5. Therefore, the output voltage Vout is substantially equal to half of the power voltage VDD.

When the second input voltage Vin2 is greater than the first input voltage Vin1, because the second current I2 is reduced and the third current I3 is increased due to the characteristics of the differential input circuit 102, the fourth current I4 and the fifth current I5 are reduced and the current of the sixth current flowing into the transistor M12 is increased. As the result, the output voltage Vout rises.

Conversely, when the second input voltage Vin2 is less than the first input voltage Vin1, because the second current I2 is increased and the third current I3 is recued due to the characteristics of the differential input circuit 102, the fourth current I4 and the fifth current I5 are increased and the current of the sixth current flowing into the transistor M12 is reduced. As the result, the output voltage Vout drops.

However, the fourth current I4 may not be equal to the fifth current I5 because of factors like the non-ideal effects in the practical semiconductor process. Consequently, when the first input voltage Vin1 is equal to the second input voltage Vin2, the output voltage Vout may have errors and fail to be substantially equal to half of the power voltage VDD. For example, when the first input voltage Vin1 is equal to the second input voltage Vin2, if the fourth current I4 is greater than the fifth current I5, the output voltage Vout will have an output voltage error +Verr2. Conversely, when the first input voltage Vin1 is equal to the second input voltage Vin2, if the fourth current I4 is less than the fifth current I5, the output voltage Vout will have an output voltage error −Verr2. The output voltage error +Verr2 and the output voltage error −Verr2 will lead to a shifting in the diagram showing the conversion curve of the input/output voltages of the differential amplifier 100, as shown by FIG. 2.

It should be noted that, the resistor R1 and the resistor R2 of FIG. 1 can reduce quantity of the output voltage error +Verr2 and the output voltage error −Verr2. For example, when the first input voltage Vin1 is equal to the second input voltage Vin2, if the fourth current I4 is greater than the fifth current I5, because of the presence of the resistor R1 and the resistor R2, a source voltage of the N-type transistor M5 will be higher than a source voltage of the N-type transistor M6, (i.e., the voltage difference Vgs5<the voltage difference Vgs6). Accordingly, the fourth current I4 is suppressed and a difference between the fourth current I4 and the fifth current I5 is reduced so the output voltage error +Verr2 can be reduced. On the other hand, if the fourth current I4 is less than the fifth current I5, because of the presence of the resistor R1 and the resistor R2, the source voltage of the N-type transistor M6 will be higher than the source voltage of the N-type transistor M5, (i.e., the voltage difference Vgs6<the voltage difference Vgs5). Accordingly, the fifth current I5 is suppressed and the difference between the fourth current I4 and the fifth current I5 is reduced so the output voltage error −Verr2 can be reduced.

Figure 3:
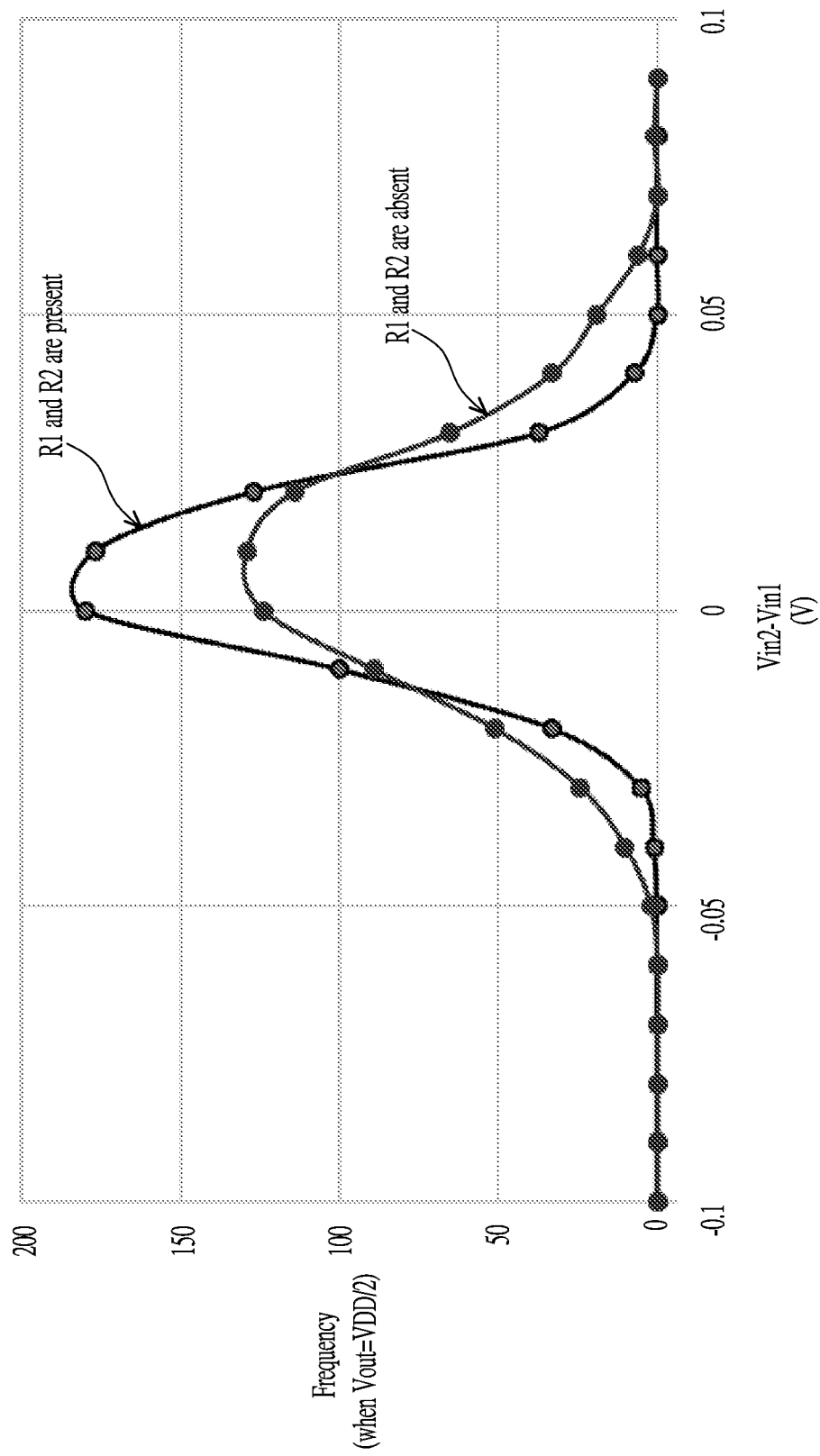
FIG. 3 is a chart showing statistical analysis of random numbers of the input/output voltages of the differential amplifier shown in FIG. 1.
Figure 4A:
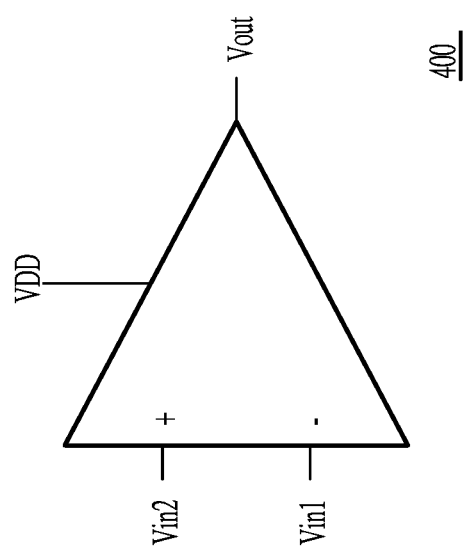
FIG. 4A is a schematic diagram of a differential amplifier in prior art.
Figure 4B:
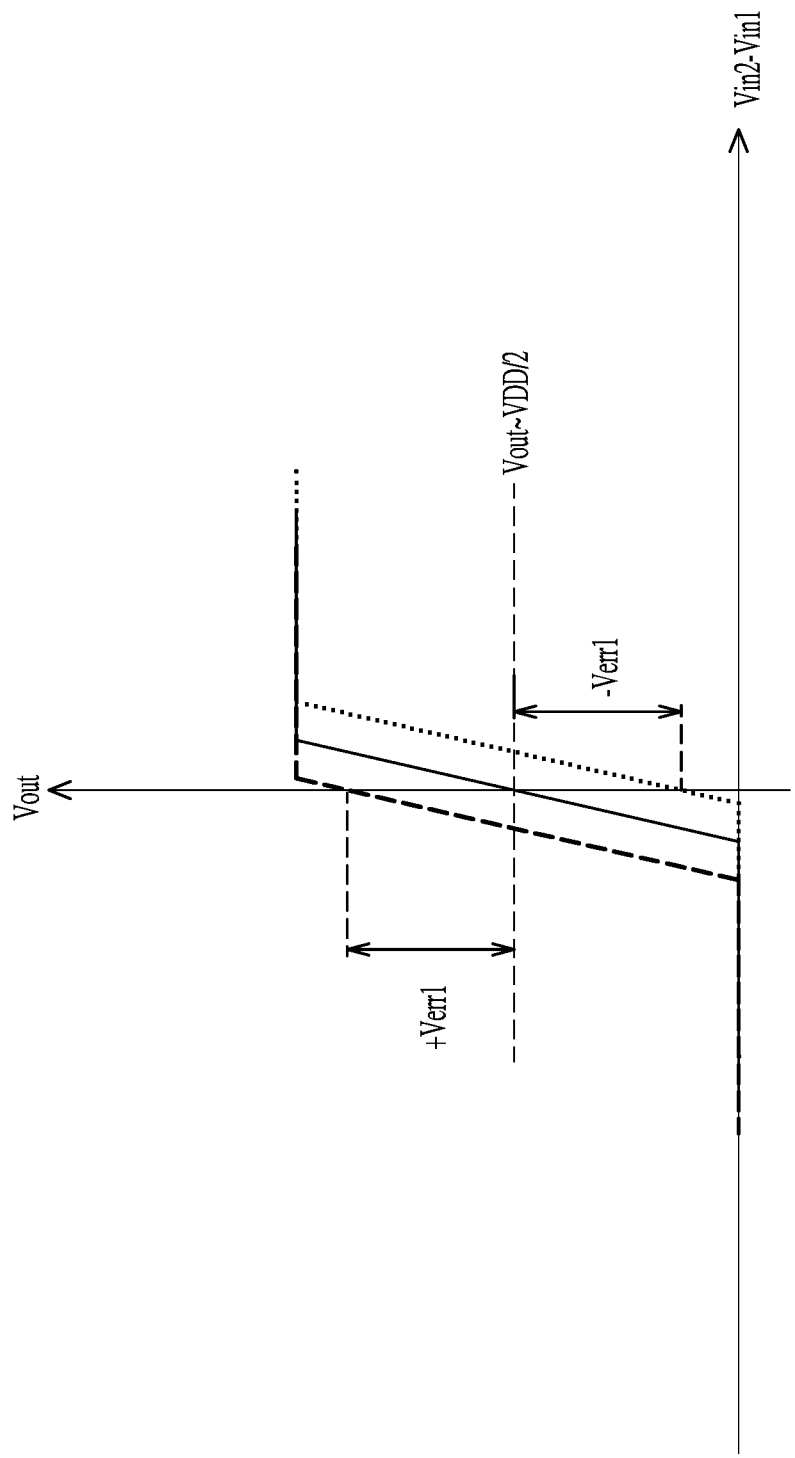
FIG. 4B is a diagram showing a conversion curve of the input/output voltages of the differential amplifier shown in FIG. 4A.

FIG. 3 is a chart showing statistical analysis of random numbers of the input/output voltages of the differential amplifier 100 in a situation where the resistors R1/R2 are present and a situation where the resistors R1/R2 are absent. In the drawing, a horizontal axis represents the second input voltage Vin2 minus the first input voltage Vin1, and a vertical axis represents a frequency at which the output voltage Vout is equal to half of the power voltage VDD. In view of FIG. 3, it can known that a statistical distribution of the differential amplifier 100 is more concentrated at where the second input voltage Vin2 equal to the first input voltage Vin1 in the situation where the resistance R1/R2 are present than a statistical distribution in the situation where the resistors R1/R2 are absent. In other words, in the situation where the resistors R1/R2 are present, the differential amplifier 100 can reduce the output voltage errors.

In summary, with the capability of reducing the shifting of the conversion curve of the input/output voltages to reduce the output voltage errors, the differential amplifier according to the invention is applicable to circuits that require high accuracy, such as the voltage detectors or voltage comparators.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A differential amplifier, comprising:
   a differential input circuit, adjusting a second current and a third current flowing into the differential input circuit according to a first input voltage, a second input voltage, and a first current;
   a first current source circuit, coupled between the differential input circuit and a ground terminal, and generating the first current according to a first reference voltage and a third reference voltage;
   a current-mirror circuit, coupled between an output terminal and the ground terminal, and generating a fifth current according to a fourth current and the third reference voltage;
   a second current source circuit, coupled between a power terminal and the output terminal, and generating a sixth current and a seventh current according to a second reference voltage, a first part of the sixth current flowing into the differential input circuit and forming the second current, a second part of the sixth current flowing into the output terminal, a first part of the seventh current flowing into the differential input circuit and forming the third current, a second part of the seventh current flowing into the current-mirror circuit and forming the fourth current; and
   an impedance circuit, coupled between the current-mirror circuit and the ground terminal.

2. The differential amplifier according to claim 1, wherein the differential input circuit comprises:
   a first transistor, the first transistor being controlled by the first input voltage, the second current flowing into a first terminal of the first transistor,
   a second transistor, the second transistor being controlled by the second input voltage, the third current flowing into a first terminal of the second transistor.

3. The differential amplifier according to claim 1, wherein the first current source circuit comprises:
   a third transistor, the third transistor being controlled by the first reference voltage and generating the first current.

4. The differential amplifier according to claim 3, wherein the first current source circuit further comprises:
   a fourth transistor, the fourth transistor being connected to the third transistor in series.

5. The differential amplifier according to claim 1, wherein the current-mirror circuit comprises:
   a fifth transistor, the fourth current flowing into a first terminal of the fifth transistor; and
   a sixth transistor, a control terminal of the sixth transistor being connected to a control terminal of the fifth transistor.

6. The differential amplifier according to claim 5, wherein the current-mirror circuit further comprises:
   a seventh transistor, the seventh transistor being connected to the fifth transistor in series, a first terminal of the seventh transistor being connected to the control terminal of the fifth transistor; and
   an eighth transistor, the eighth transistor being connected to the sixth transistor in series, a control terminal of the eighth transistor being connected to a control terminal of the seventh transistor.

7. The differential amplifier according to claim 1, wherein the second current source circuit comprises:
   a ninth transistor, the ninth transistor being controlled by the second reference voltage and generating the seventh current; and
   a tenth transistor, the tenth transistor being controlled by the second reference voltage and generating the sixth current.

8. The differential amplifier according to claim 7, wherein the second current source circuit further comprises:
   an eleventh transistor, the eleventh transistor being connected to the ninth transistor in series; and
   a twelfth transistor, the twelfth transistor being connected to the tenth transistor in series, a control terminal of the eleventh transistor being connected to a control terminal of the twelfth transistor.

9. The differential amplifier according to claim 1, wherein the impedance circuit comprises:
   a first resistor, one end of the first resistor being connected to the current-mirror circuit, another end of the first resistor being connected to the ground terminal; and
   a second resistor, one end of the second resistor being connected to the current-mirror circuit, another end of the second resistor being connected to the ground terminal.

* * * * *